United States Patent [19]
Henrich

[11] Patent Number: 4,486,703
[45] Date of Patent: Dec. 4, 1984

[54] BOOST VOLTAGE GENERATOR

[75] Inventor: Robert S. Henrich, Farmington Hills, Mich.

[73] Assignee: The Bendix Corporation, Southfield, Mich.

[21] Appl. No.: 423,937

[22] Filed: Sep. 27, 1982

[51] Int. Cl.³ .............................................. G05F 1/10
[52] U.S. Cl. .................................................... 323/222
[58] Field of Search .................. 323/222, 282; 363/20, 363/21

[56] References Cited
U.S. PATENT DOCUMENTS
4,413,224  11/1983  Krupka et al. ...................... 323/222

OTHER PUBLICATIONS

"Mechanism and Application of a Monolithic (Power) Circuit Controller", T. Vaeches, Elektron, Prax. (Germany), vol. 15, No. 1, Jan. 1980.

Primary Examiner—William M. Shoop
Attorney, Agent, or Firm—Markell Seitzman; Russel Wells

[57]  ABSTRACT

Circuitry (20) for activating fuel injectors (50) of an internal combustion engine including a plurality of switching circuits (60) for turning on and off associated hybrid power circuits (80). The hybrid power circuits (80) communicate the increased level of voltage generated by a single boost voltage generator (70) to particular injectors (50).

10 Claims, 9 Drawing Figures

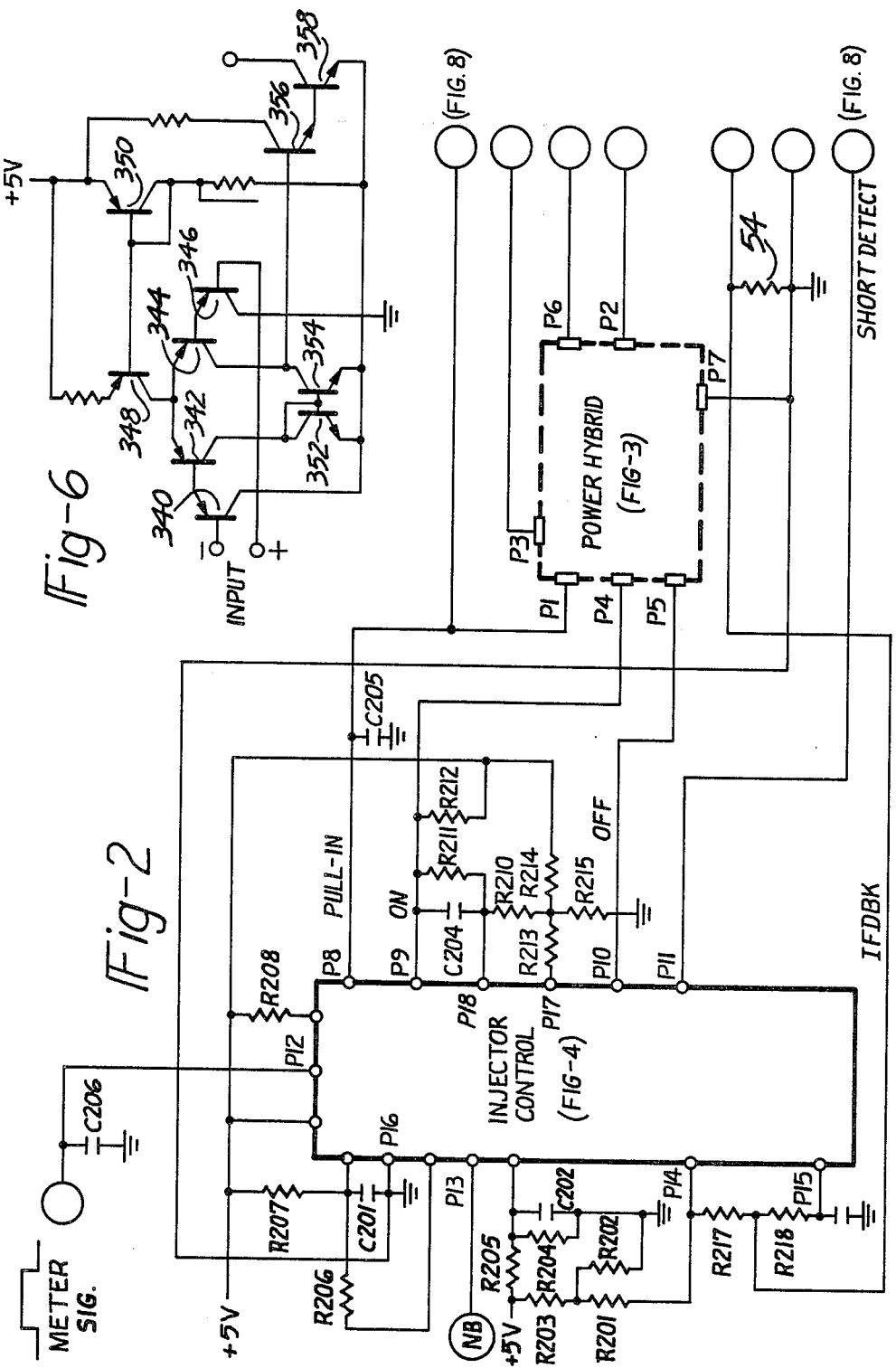

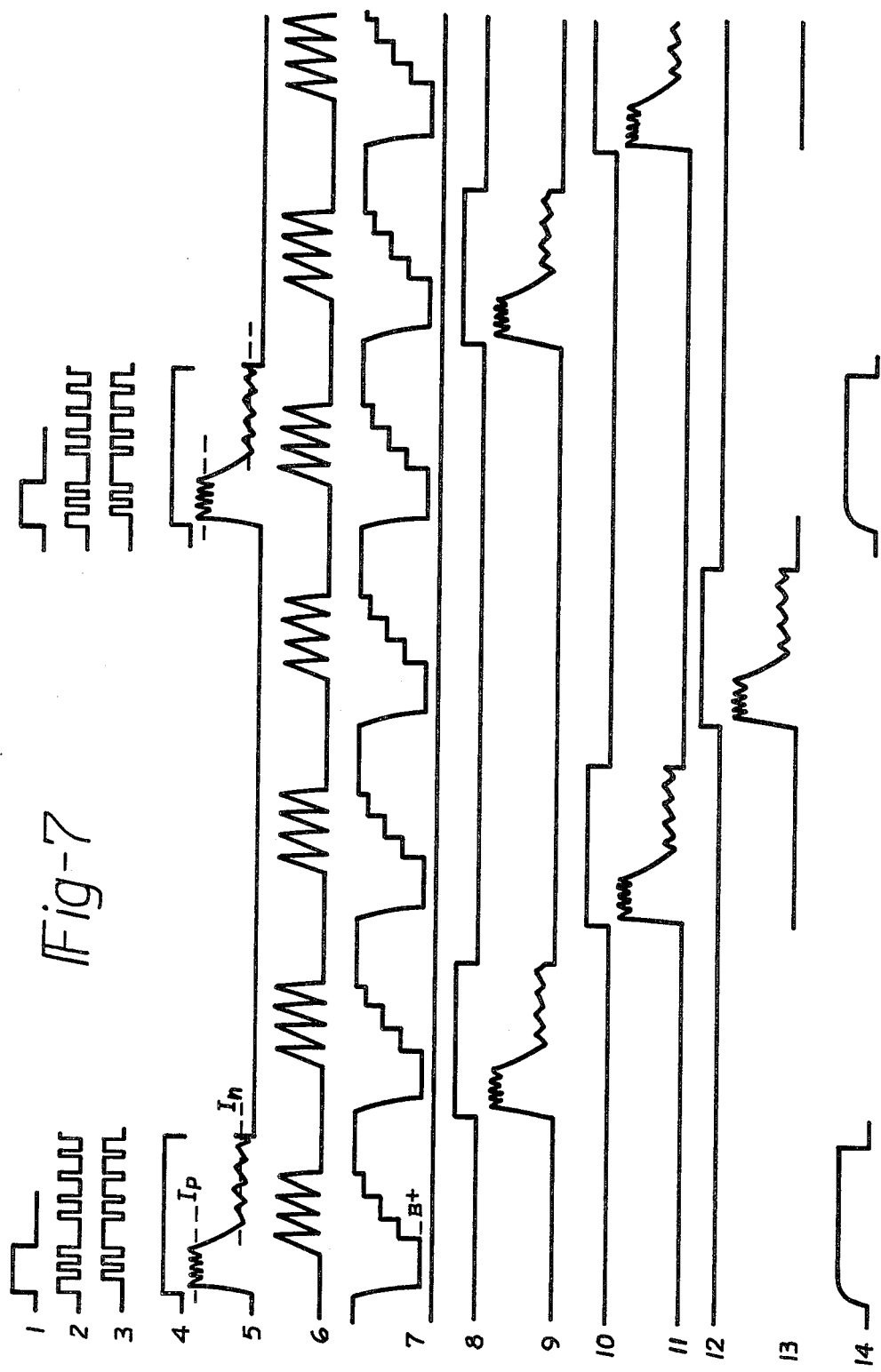

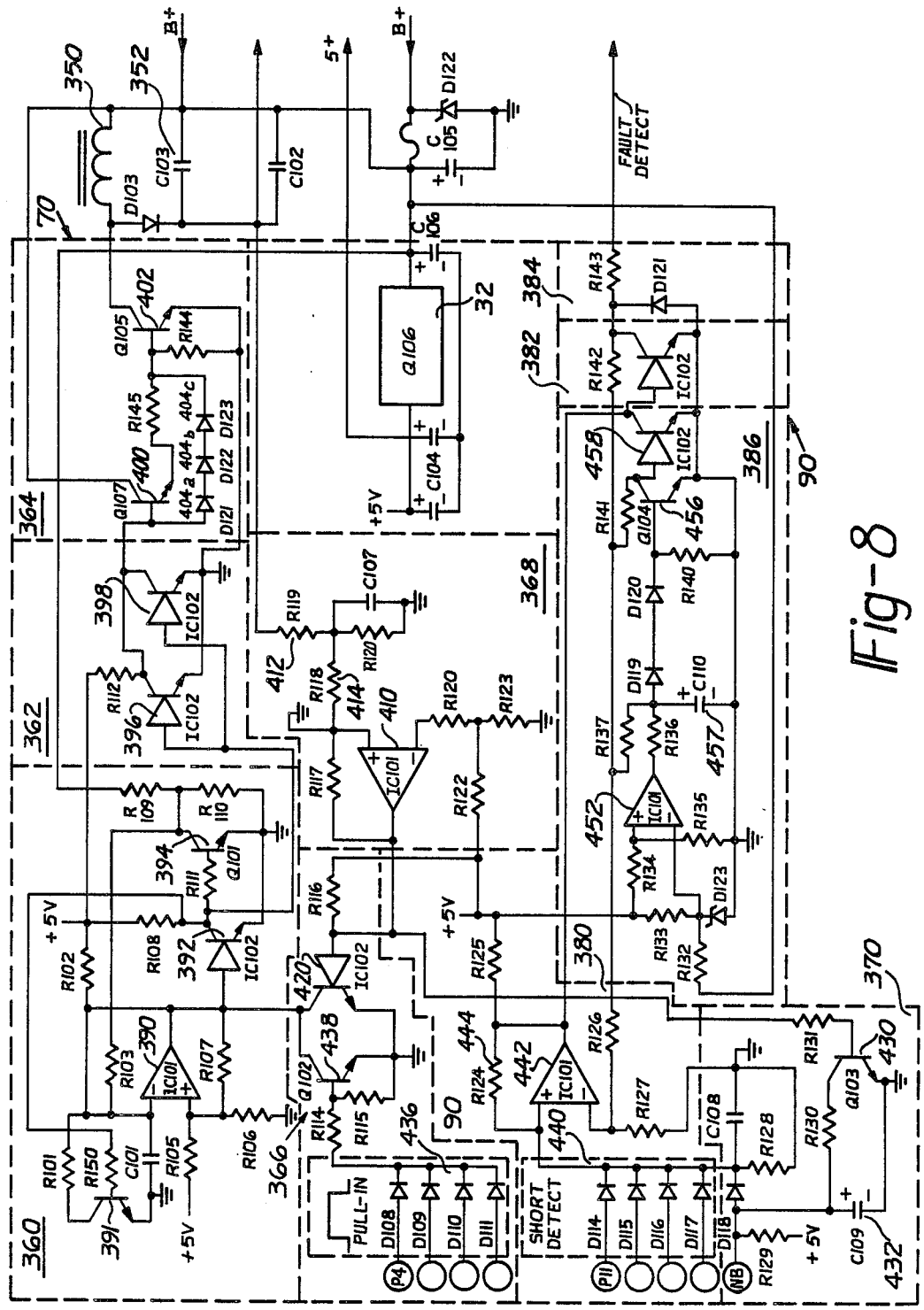

4,486,703

BOOST VOLTAGE GENERATOR

This application is related to a commonly assigned, co-filed patent application entitled "Switching Type Driver Circuit for Fuel Injector", and now U.S. Pat. No. 4,479,161.

BACKGROUND AND SUMMARY OF THE INVENTION

This invention relates to nonlinear circuits for driving inductive loads and in particular to a boost voltage generator for use in a fuel injection system of an internal combustion engine.

Previous circuits for injectors for internal combustion engines utilized linear solenoid driving circuits to generate and deliver a rapid change in the rise current of a coil of a solenoid valve associated with a fuel injector. These linear driver circuits and/or systems used feedback techniques to control the level of injector current and often employed a boost voltage network to produce an increased voltage level that periodically overdrove the injector coil. These prior systems work adequately, however, they are often characterized as having high power consumption. In addition, large enclosures are often associated with these systems since it is necessary to dissipate the excess heat generated. The present invention offers a solution to the above problems by providing a driver circuit which functions in a switching mode of operation.

Accordingly, the invention comprises:

A pulsed switching type boost voltage generator responsive to a pull-in signal for generating and for storing a boost voltage signal in excess of the voltage established by a battery in synchronism with the generation of the pull-in pulse.

The circuitry utilizes comparator circuits throughout to lessen the requirement for accurate gain control and accurate amplifier offsets. A feature of the present invention is the incorporation therein of means to adapt its operation in correspondence with the variation of battery voltage and temperature thereby maintaining a uniform output over wide ranging conditions.

Many other objects, features and purposes of the present invention will become clear from the following detailed description of the drawings.

BRIEF DESCRIPTION OF THE DRAWINGS

In the drawings:

FIG. 2 illustrates a partial block diagram of some major components of the invention.

FIG. 6 shows a circuit diagram for another type of comparator utilized in FIG. 5.

FIG. 7 illustrates some of the major waveforms generated by the present invention.

FIG. 8 illustrates a boost voltage generator and diagnostic circuit.

DETAILED DESCRIPTION OF THE DRAWINGS

Figure 1:
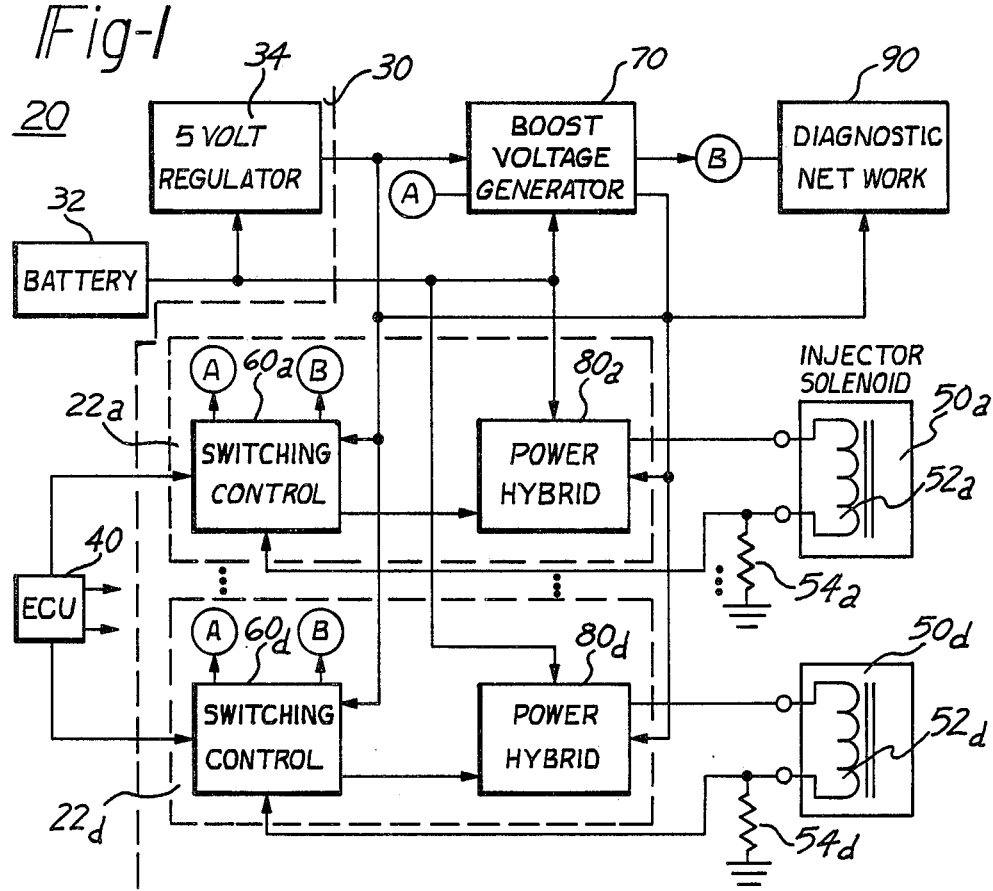
FIG. 1 is a block diagram of the solenoid control unit or driver circuit.

Reference is now made to FIG. 1 which illustrates a block diagram of the present invention. More particularly, there is shown a solenoid control unit 20 having a plurality of switching driver circuit 22a-d for driving a plurality of fuel injectors 50 of an internal engine (not shown) wherein each of the fuel injectors embodies a solenoid having a coil 52. Each coil 52 is connected to as associated sense resistor R54. The solenoid control unit 20 is connected to a power supply means 30 including a battery 32 and a voltage regulator 34. The solenoid control unit 20 is responsive to the output of an electronic control unit (ECU) 40 of a known variety which generates a series of metering pulses of determinable length in response to at least one engine operating parameter. Each metering pulse is preferably distributed to a particular driving circuit 22 that is associated with a specific one of the fuel injectors 50 or with a group of fuel injectors. Each driving circuit 22 of the solenoid control unit 20 further includes a switching circuit 60, one associated with each fuel injector 50 that is adapted to receive a particular one of the metering pulses. An exemplary switching circuit 60 is more fully described in conjunction with FIGS. 2 and 4. Each switching circuit 60 utilizes current feedback from its corresponding sense resistor R54 and includes inter alia, means for generating a pull-in signal in response to a particular one of the metering pulses, an on-control circuit for generating an on-control signal and an off-control circuit 66 for generating an off-control signal. These latter functions are discussed in conjunction with the description of FIG. 4. The solenoid control unit 20 further includes one switching type boost voltage generator 70 for generating a boost signal for each driving circuit 22. This boost voltage substantially exceeds the voltage established by the battery 32 and is generated in synchronism with each pull-in pulse generated by the appropriate switching circuit 60. It should be noted that FIG. 1 illustrates a system for controlling four injectors. However, the invention is not so limited. The detailed embodiment of the boost voltage generator 70 is discussed in conjunction with FIG. 8. The solenoid control unit 20 further includes power hybrid circuits 80a-d, one associated with each injector 50, responsive to the boost voltage signal generated by the boost voltage generator 70, to the on-control signal and to the off-control signal generated by its associated switching circuit 60 for selectively applying the boost voltage to a particular one of the fuel injectors 50. The solenoid control unit 20 may further include a diagnostic network 90 which monitors the current in each injector coil 52 to determine failure conditions such as a short circuit to ground or which monitors the failure of the circuit to generate the boost voltage. The diagnostic network 90 is discussed in further detail in connection with FIGS. 8 and 9.

Figure 3:
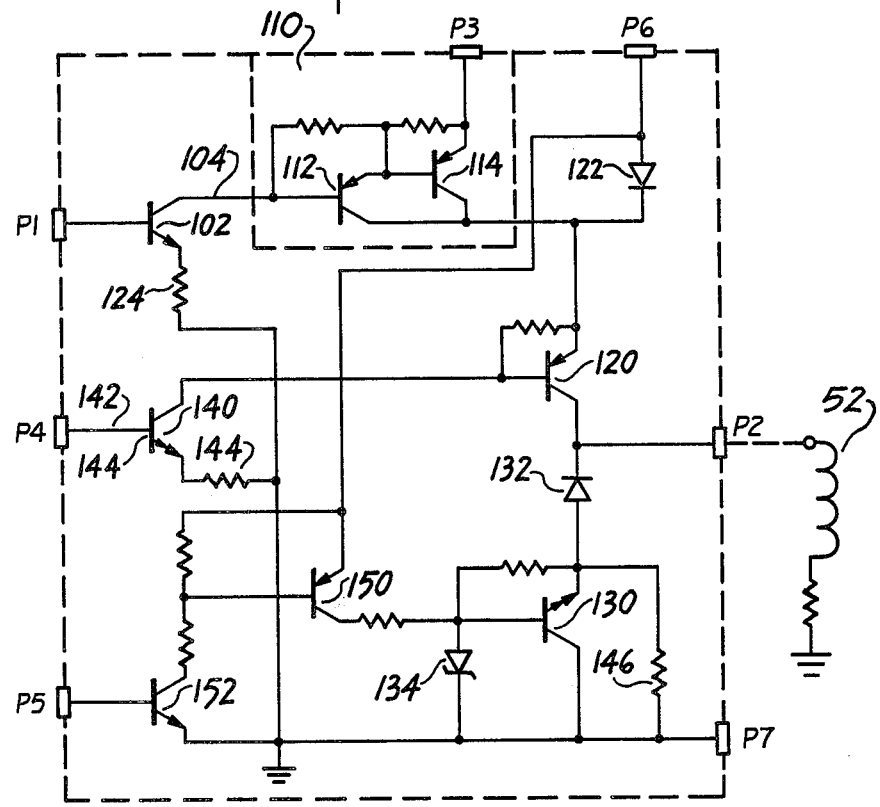
FIG. 3 shows a circuit diagram of a power hybrid circuit.

Reference is now made to FIGS. 2 and 3. FIG. 2 illustrates the interrelationship between an exemplary hybrid power circuit 80 and its cooperating switching circuit 60. The detailed embodiment of the hybrid power circuit 80 is shown in FIG. 3. The pins P1-P7 of the hybrid power circuit 80 are connected as follows: pins P1, P4 and P5 are adapted to receive the pull-in signal, the on-control signal and the off-control signal generated by its associated switching circuit 60. Pin P3 is adapted to receive the boost voltage generated by the output of the boost voltage generator 70, pin P6 is connected to the battery 32 while pin P2 is connected to one terminal of a solenoid coil 52. Pin P7 is connected to ground.

The major functions of the hybrid power circuit 80 are to apply power to the injector and to provide a recirculating current path for permitting the injector current to decay. The application of the boost voltage, receive at pin P3, to a particular injector coil 52 is performed in conjunction with a first drive means such as the NPN transistor 102 having an output or collector terminal 104 connected to a Darlington pair 110 comprising transistors 112 and 114. The emitter terminal of transistor 102 is connected to ground through a resistor R124. The emitter terminal of transistor 114 is adapted to receive the boost voltage signal generated by the boost voltage generator 70. The output or collector terminals of transistors 112 and 114 are connected to a switch or power source transistor 120 and to the positive battery potential through a blocking diode 122. The output or collector terminal of the power source transistor 102 is connected, through pin P2, to one terminal of a particular injector coil 52 and to a recirculating transistor 130 through a second diode 132. The conductivity of the power source transistor 120 is controlled by the switching transistor 140 having its base 142 adapted to receive the on-control signal generated by a particular switching circuit 60. The collector of transistor 140 is connected to the base of transistor 120 while the emitter of transistor 140 is connected via resistor R144 to the other terminal of resistor 124 and to ground. The on-control signal is transmitted to the power source transistor 120 through transistor 140 and turns transistor 120 into a fully conductive state just prior to the application of the boost voltage which is generated in response to the delayed pull-in signal. The capacitor C205 with current source resistor R235 (FIG. 4) provides a delay of 1 to 3 microseconds when compared to the leading edge of the "on signal". By activating the power source transistor 120 one to three microseconds prior to the application of the rather high level boost voltage, the voltage stress reduces across the power source transistor 120. Another feature of the present invention is the reduction of the amount of boost voltage drain and excess drive current to the power source transistor 120. This is accomplished by the current limitor arrangement performed by the emitter resistors 124 and 144. Each power hybrid circuit 80 includes the recirculating transistor 130 that is connected to the power source transistor 120 and adapted to be connected across a particular injector coil 52 to ground. A resistor 146 is connected across the transistor 130 to reduce its voltage stress. The recirculating transistor 130 is turned on by the off-control signal generated by its corresponding switching circuit means 60 during instances when the power source transistor 120 is nonconductive, thus providing a temporary recirculating current path for the injector coil current to decay. A clamp means such as a Zener diode 134 is connected between the input to or the base of the recirculating transistor 130 and ground potential for producing a controlled voltage discharge clamp across its corresponding injector coil 52 thus permitting the injector voltage to go negative and to provide a discharge path to quickly decrease the injector coil current upon termination of the off-control signal. The power hybrid circuit 60 includes another switching transistor 150 having its emitter terminal connected to the battery and its collector terminal connected to the input of the recirculating transistor 130. A transistor 152 is further provided with its base adapted to receive the off control signal. Its collector is communicated to the base and collector of the transistor 150 and its emitter connected to ground potential. The transistors 150 and 152 communicate the off-control signal to the recirculating transistor 130.

In operation, the recirculating transistor 130 is normally maintained in its nonconductive state. The power source transistor 120 is made conductive through the operation of transistor 140 in response to the on-control signal just prior to the application of the boost voltage at pin P3 thus providing a coil current charging path through the Darlington pair 112 and 114 to a particular injector coil 52 that is connected at the terminal P2. The drive transistor 102 is switched to its conductive state in response to the pull-in signal just prior to the application of the boost voltage which as described below is also generated in response to the pull-in signal. The power source transistor 120 is periodically switched to its nonconductive state upon the removal of the on-control signal. The current within the injector coil 52 is permitted to rapidly decay by energizing transistors 150 and 152, which in turn applies battery potential to the base of the recirculating transistor 130 therein permitting the injector coil current to discharge (when the Zener diode 134 is activated) through a recirculating path comprising transistor 130, commutating diode 132, the injector coil 52, and sense resistor 54. The diode 132 is a blocking diode when transistor 120 is activated and as mentioned also provides a current path in the recirculating current mode. The circuit illustrated in FIG. 3 is compatible and designed to interface with low voltage digital logic circuitry.

Figure 5:
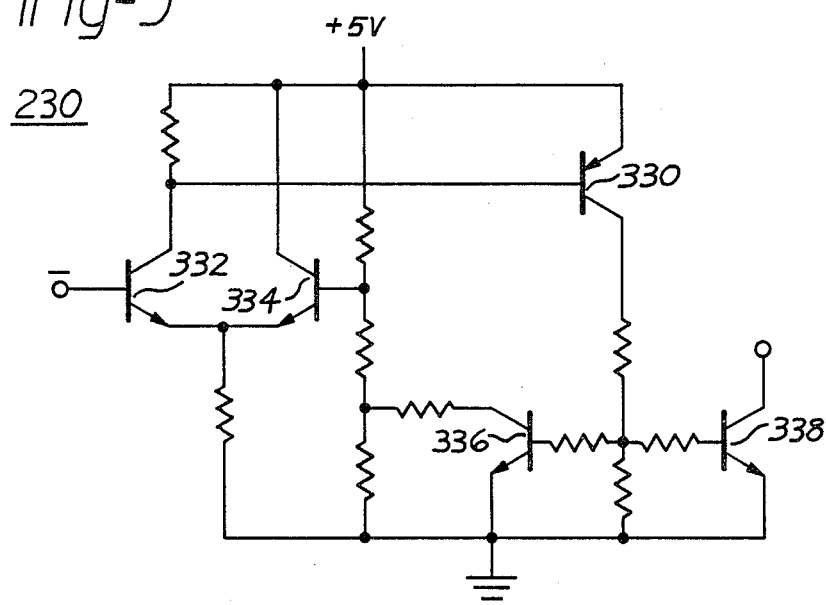
FIG. 5 shows a circuit diagram for one type of comparator circuit utilized in FIG. 5.
Figure 4:
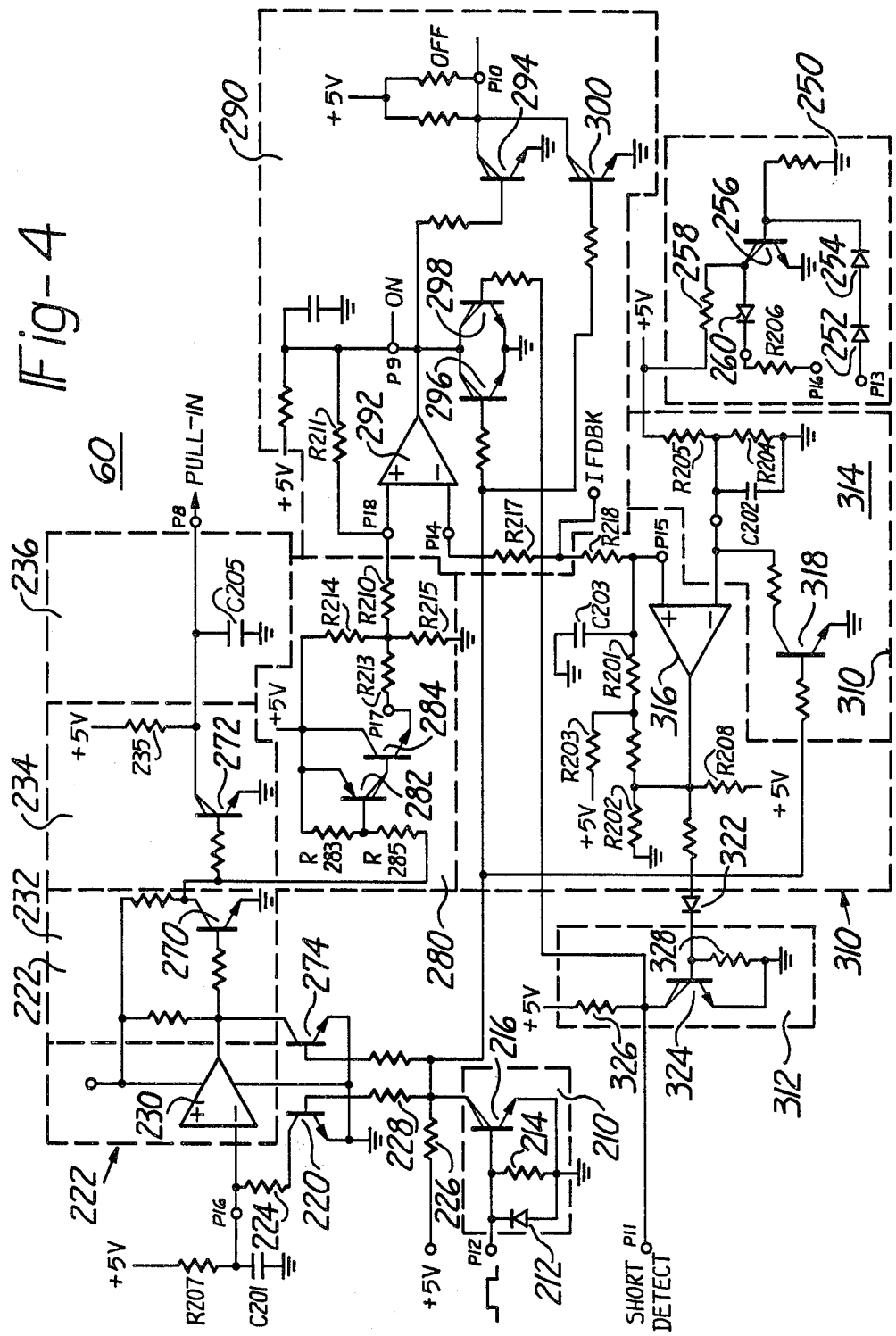
FIG. 4 illustrates a switching control network.

Reference is made to FIG. 4 which illustrates an embodiment of the switching network or circuit 60. FIG. 4 illustrates circuitry for performing the total switching function and closed loop control performed by the switching network 60. It is envisioned that most of the circuitry illustrated in FIG. 4 can be constructed by utilizing a semi-custom integrated circuit chip. Various components such as diodes, resistors and capacitors because of their function and/or size are not conveniently incorporated within an integrated circuit. These components are designated by a D, R or C followed by a representative numeral. These components are further illustrated in FIG. 2. The circuit utilizes three comparators 230, 292 and 316 the details of which are shown in FIGS. 6 and 7. The output signals generated by the switching network 60 are the pull-in signal (pin P8), the on-control signal (pin P9), the off-control signal (pin P10) and a short circuit detect signal (pin P11). The input signals utilized by the switching control network 60 are metering signals, derived from the ECU and communicated to pin P12, a NO BOOST (NB) signal derived from the boost voltage generator 60 (see FIG. 8) and communicated to pin P13 and the injector coil current designated as IFDBK communicated from a particular sense resistor 54 of a corresponding injector 50 and thence to pins P14 and P15. The metering signal received at pin P12 is communicated to an input buffer 210 comprising a reverse voltage protection diode 212, resistor 214 and an NPN transistor 216. The output or collector terminal of transistor 216 is communicated to another NPN transistor 220 having its emitter terminal grounded and its collector terminal connected to the input of a pull-in buffer 222 at pin P16 through a resistor 224. In the absence of a metering pulse the base of transistor 220 is maintained at a positive potential set by the regulated voltage source 32 and by the voltage divider network comprising resistors 226 and 228. The transistor 220 discharges capacitor C201 at the removal of the meter pulse. The pull-in buffer 222 comprises a comparator 230, a first inverter 232, a second inverter 234 and an output network 236. The details of comparator 230 are shown in FIG. 5. Although not shown in FIG. 4, an hysteresis network is built into comparator 230. The output of comparator 230 is connected to the inverter 232 which in turn communicates with invertor 234. The inverters 232 and 234 comprise transistors 270 and 272, respectively with appropriate biasing resistors. The output conditioning network 236 which is connected to inverter 234 comprises the external capacitor C205. The input or negative terminal of comparator 230 which comprises, inter alia, a one shot monostable multivibrator is communicated with the collector terminal of transistor 220 through the resistor 224. The negative terminal of the comparator 230 is further communicated with an externally positioned resistor-capacitor combination R207, R206, R258, and C201 which is connected at pin P16. The values of the resistor-capacitor combination R207, R206, R258, and C201 establish the width of the pull-in pulse. A pulse width modification circuit 250, the operation of which is described below has an input that is adapted to receive the no boost signal at pin P13 and an output that is communicated to pin P16 which is the input to the comparator 230. The pulse width modification circuit 250 is used to increase the pulse width of the pull-in signal during intervals when the boost signal cannot be generated by the boost voltage generator 70. This circuit comprises a series pair of diodes 252 and 254 that are communicated to the input or base of a transistor 256. The output or collector terminal of transistor 256 is biased through the operation of the resistor 258 and is further communicated to the input of comparator 230 through diode 260 and the external resistor R206. The pull-in pulse width is increased by activating the transistor 256 which removes resistor R206 as one of the current charging sources to capacitor C201.

The output of the comparator 230 is connected to the base or input of transistor 270. In addition, the output of comparator 230 is connected to the input buffer 210 through the switching transistor 274. The collector of transistor 274 is connected to the output of the comparator 230 while its emitter terminal is grounded. The output of the inverter 232 is connected to the input of the second inverter 234 which comprises the base terminal of transistor 272. The inverter 234 also acts as an output buffer and has a high output current capability. The pull-up resistor 235 typically ranges from 740 ohms to 1 K. The output of the inverter 232 is further communicated to a voltage source network 280 which comprises the PNP transistor 282, the NPN transistor 284 and the resistor divider network comprising resistors R210, R213, R214 and R215. The voltage source network 280 establishes a bi-level voltage reference which is used to establish the bi-level injector current ($I_p$, $I_h$) permitted to flow within a particular injector coil 52 during the pull-in phase of operation and during its hold phase of operation. The resistor network (R210-R215) is connected between pins P17 and P18 of the integrated circuit wherein pin P18 comprises one of the inputs for an on/off switch control network 290. The on/off switch control network 290 comprises another comparator 292. The output of comparator 292, at pin P9, generates the on-control signal which is communicated to the hybrid power circuit 80. The output of comparator 292 is fed back though the hysteresis feedback resistor R211 to its positive input terminal to control switching. Due to the switching nature of the system, many electrical noise spikes are generated. The hysteresis provided by resistor R211 introduces noise immunity. A voltage signal designated as IFDBK, indicative of the current flowing within a particular coil, is communicated to resistor R217 and then to pin P14 which comprises a negative input of comparator 292. The output of comparator 292 is gated by the magnitude of the current feedback signal (IFDBK) to generate the on-control signal and the off-control signal which contributes to the saw-toothed oscillation of the injector current as illustrated in line 7 of FIG. 7. The output of the comparator 292 is connected to pin P10 which constitutes the off-control signal terminal through a switching transistor 294. The output of comparator 292 is further connected to ground through the collector-emitter junction of the transistors 296 and 298. The input or base terminal of transistor 296 is communicated to the output of the input buffer 210. As can be seen during instances where a metering signal is not received by the input buffer circuit 210, the base terminal of transistor 296 is maintained at a positive potential thus placing transistor 292 in a conductive state. The conductivity of transistor 298 is controlled by the short detect circuitry as described below. In addition when the transistor 298 is activated the on-control signal will be inhibited. The output of the input buffer circuit 210 is further communicated to another switching transistor 300, the output of which is connected to the collector of transistor 294. The transistor 300 is used to inhibit the generation of the off-control signal during the receipt of a metering pulse.

The short detect circuitry comprises a monitor 310, the output of which is communicated to an inverter and buffer 312. The purpose of the short detect circuitry is to detect whether or not a particular injector coil is shorted at the ground by monitoring the level of injector current and comparing it to a reference function. As described in detail below, a reference time function or wave form is generated upon the application of a metering pulse. This reference function or wave form is compared to the sensed current (IFDBK). Should the level of the sensed current at any time be less than the current reference level, a short detect signal is generated. The short detect circuitry renders transistor 298 conductive therein turning it off and prohibiting further generation of the on-control signal at pin P9, i.e., inhibiting the particular switch control network 60. The monitor 310 comprises a function generator 314 and an associated comparator circuit 316. The circuitry shown in FIG. 6 can be substituted for comparator 316. The function generator 314 comprises a switching transistor 318, and the resistor-capacitor combination R204, R205, and C202, the output of which is connected to the negative or input terminal of the comparator circuit 316. The values of the resistor-capacitor combination R204, R205, and C202 are chosen to establish the signal shape and level of the reference function. A typical reference function is shown in line 14 of FIG. 7. The positive input terminal of the comparator 316 is adapted to receive the injector current feedback signal (IFDBK) through the resistor R218. The output of the comparator 316 is communicated through a diode 322 to the buffer inverter circuit 312 which comprises the output transistor 324 appropriately biased by the resistors 326 and 328. The output or collector terminal of transistor 324 is also connected to the base terminal of transistor 298 and further serves to define one of the short detect signals which are communicated to the diagnostic circuit shown in FIG. 8.

Reference is briefly made to FIG. 5 which illustrates a detailed embodiment of comparator 230 as illustrated in FIG. 4. As shown therein the comparator comprises a signal PNP transistor 330 and four NPN transistors 332–338 wherein transistor 338 is of the open collector variety and defines the output terminal of comparator 230. A plurality of resistors provides the appropriate referencing and hysteresis. FIG. 6 illustrates circuitry that could be utilized in conjunction with comparators 292 and 316. This comparator comprises six PNP transistors 340–350 and four NPN transistors 352–358. The base terminals of transistors 340 and 346 define the input terminals of this comparator while the collector terminal of transistor 358 defines its output terminal.

Reference is briefly made to FIG. 7 which illustrates the major wave forms generated by the present invention. More particularly, there is illustrated the various metering signals received by the various switching networks 60a–d. These metering signals or pulses are shown on lines 4, 8, 10 and 12 of FIG. 7. As mentioned above and described in detail below each switching network 60 generates a pull-in signal in response to the metering signal. An exemplary pull-in signal is illustrated on line 1. Lines 2 and 3 of FIG. 7 illustrate the switching nature of the on and off control signals. It should be understood that each switching network 60 will generate its corresponding pull-in, on and off control signals. Lines 6 and 7 of FIG. 7 illustrate the pulsed current flowing within a boost coil of the boost voltage generator 70 and the boost voltage signal. These wave forms are further discussed in connection with FIG. 8. The bi-level injector current for each of the injectors is shown on Lines 5, 9, 11 and 13. Finally, one of the reference time functions discussed above that is utilized in conjuction with the short detect circuit is shown on line 14. As can be seen from FIG. 7 prior to the energization of a particular injector 50 the boost voltage resides at a substantially high level. The boost voltage is thereafter applied to a particular injector 50 through its corresponding power source transistor 120. After the initial application of the boost voltage to a particular injector the injector current rises to the pull-in level ($I_p$) whereupon the on-control signal and the off-control signal are selectably switched on and off to produce the oscillating or saw tooth appearing injector current. Upon the removal of the pull-in pulse the injector current is permitted to naturally decay via the recirculating loop to the hold current level ($I_h$). After the boost voltage has been transferred to a particular injector 50 and as described hereafter, it is regenerated for reapplication to another injector.

The operation of the switching control network described above follows. The resistor-capacitor combination R207, R206, R258, and C201 connected to comparator 230 establishes a predetermined pull-in pulse width length. During periods not involving receipt of a metering pulse, transistor 220 is maintained in a conductive state which short circuits the output voltage from capacitors C201 to ground. Upon receipt of an input or metering pulse, transistor 216 is rendered conductive. Transistor 220 is rendered nonconductive thus permitting capacitor C201 to charge and generate the pull-in signal. The voltage at capacitor C201 will trigger comparator 230 to generate a pull-in signal of predetermined width which is thereafter buffered by the buffers 232 and 234 to generate the pull-in signal which is communicated to a corresponding hybrid powered circuit 60. As previously described, the pull-in signal will be used to generate a boost voltage signal which shall be applied to a particular injector. To prevent overheating of the activated injector it is desirable that during the initial phase of operation of the injector that is, during the pull-in pulse it is desirable to regulate the injector current at a high or pull-in ($I_p$) level and to thereafter reduce the regulated current level to a lower or hold level ($I_h$). A high current level is necessary to develop sufficient magnetic force to actuate the injector. A much lower force is needed to hold the injector in the activated position. Lower current level reduces circuit stress. This current regulation is established by the voltage regulator circuit 280. The output or regulated voltage is generated at pin P17. During times involving the generation of a pull-in signal, the voltage at pin P17 is established by the combination of the 5 volt reference supply and the additional voltage generated by the pull-in signal which is also communicated to pin P6 through the transistors 282 and 284, respectively.

The joint application of these voltages establishes the first or high current reference level. Upon termination of the pull-in pulse the output of the buffer 232 is returned to a low condition. Consequently, the voltage at the positive input of comparator 292 is now set by the reference supply and is reduced to a lower voltage level corresponding to the desired level of hold current.

When the magnitude of the current feedback (IFDBK) is less than that established by the output of the voltage source circuit 280 the on-control signal is generated and the off-control signal is inhibited. With the on-control signal now applied to the hybrid power circuit 60 the power source transistor 120 will permit charging current to flow into the coil 54. The charging current will tend to increase because of the communication with the increased level of boost voltage or communication to the battery. During the times involving the on-control signal the current flowing through a particular injector coil 52 displays a positive or increasing tendency. During those periods when the coil current exceeds that level of current established by the voltage source circuit 280 the on-control circuit is inhibited thus turning off the power source transistor 120 and the off-control signal is generated thus establishing a recirculating current path as heretofore described. During the generation of the off-control signal the injector coil current is permitted to decay naturally through the recirculating loop. The decay of the injector coil current is illustrated by the negative or decreasing portion of the wave forms on lines 5, 9, 11 and 13 of FIG. 7. Finally, in the absence of a metering signal the transistor 296 is maintained in a conductive state thus prohibiting the generation of the on-signal in the absence of a metering signal. During these periods transistor 300 functions similar to transistor 296. The termination of the off-control signal will permit the Zener network to quickly reduce injector current.

During times when a boost voltage signal is generated by a corresponding hybrid power circuit 80 the transistor 256 is maintained in a nonconductive state. Consequently, it can be seen that during these periods there are normally two current charging paths leading to capacitor C201. The first path is through resistor R207 and the second path is through resistors R258 and R206. If a boost voltage signal is not generated, the transistor 256 is brought into its conductive state thus eliminating the second capacitor charging path. This will cause capacitor C201 to charge at a reduced rate thus increasing a duration of the pull-in signal. The ability to increase the length of the pull-in signal permits a particular injector that is driven by the above described circuitry to be maintained operational even in the absence of boost voltage generation failure.

The operation of the short detect signal of the switching control network follows. The current feedback signal (IFDBK) is also communicated to the positive terminal of the monitor circuit comprising the comparator 316. This monitor circuitry is normally inhibited. The metering pulse turns transistor 318 off thus permitting capacitor C202 to charge and to generate the reference function which is shown in line 14 of FIG. 7. When the metering pulse is withdrawn from the transistor 318 the input or reference to comparator 316 is again reduced to zero. In this matter the comparator 316 compares the level of current feedback to the generated function or waveform. Should that level be less than the generated reference wave form, it is an indication of a short circuit and the switching control network 60 is shut off by generating a short detect signal that is used to turn on transistor 298.

Reference is made to FIG. 8 which illustrates in part, the boost voltage circuit 70 that is used to supply the boost voltage to each of the hybrid power circuits 80. In addition, FIG. 8 further illustrates a diagnostic circuit which utilizes the short detect signals generated by each switching circuit or network 60 and a no-boost signal to generate a fault signal that is sent to the ECU or to some other device to indicate that a failure has occurred such as a short circuit within a particular injector or that a malfunction in the boost generator circuit 70 has occurred, i.e., that the boost voltage is no longer being generated. The boost voltage generator circuit 70 is located in the upper portion of FIG. 8. One of the output signals generated by the boost voltage generator 70 is a series of current pulses which permits electrical energy to be transferred from the battery 32 to a boost coil 350 and thereafter to use such energy to charge a boost capacitor 352. The pulsed boost coil current as well as the increasing boost voltage stored on the capacitor 352 are illustrated in lines 6 and 7 of FIG. 7. The boost voltage generation circuit 70 comprises a number of major components. These include a free running oscillator 360 the output of which is connected to a buffer 362. The output of the buffer 362 communicates with a power driver 364. The output of the power driver 364 is a series of pulses determined by the frequency of the free running oscillator which as mentioned above, causes energy from the battery 32 to be transferred through the boost coil 350 and stored in the boost capacitor 352. The boost voltage generator 70 further includes inhibit circuitry 366 which is utilized to inhibit the operation of the free-running oscillator 360 during the occurrence of any of the pull-in signals generated by any of the corresponding switching control networks 60. In addition, the inhibit circuitry 366 is utilized to turn off the free-running generator when the boost voltage stored on capacitor 352 has risen to a predetermined level. Prior to discussing the detailed structure of the boost voltage generator 70 the other major circuit elements illustrated in FIG. 8 will be briefly discussed. That circuit further includes a level shifting circuit 368 the output of which is a reduced voltage signal indicative however of the larger boost voltage stored at capacitor 352. The output of the level shifting circuit 368 is used to gate the inhibit circuitry 366 which, in turn, will stop the operation of the free-running oscillator 360 when the boost voltage has achieved a predetermined value. The output of the level shifter 368 is communicated to a no-boost circuit 370 the output of which is a signal indicative of the fact as to whether or not boost voltage has been generated. FIG. 8 further includes the diagnostic circuitry 90 previously referred to in conjunction with FIG. 1. The diagnostic circuit 90 essentially comprises a latch 380. The latch 380 is communicated to an inverter 382 the output of which, during normal operating intervals, is a high logic level output signal. This output signal is driven into a low logic state upon the occurrence or the detection of a short circuit in one of the injectors 50. The short circuit signal is received via the diode OR gate 440. The inverter 382 is connected to an output stage 384 the output of which is the fault detect signal. The output stage 384 is adapted to communicate the fault detect signal to the electronic control unit (ECU). The diagnostic circuitry 90 further includes an initialization circuit 386 which prevents the false generation of the failure detect signal during engine startup or low engine RPM conditions. Finally, the last major component illustrated in FIG. 8 is the voltage regulator 32.

Reference is again made to the boost voltage generator 70 illustrated on the upper portion of FIG. 8. The free running oscillator 360 comprises the comparator 390 the output of which is communicated to a first NPN transistor 392 which in turn is communicated to a second NPN transistor 394. The collector of transistor 392 is connected to the base of another NPN transistor 391 which has its collector-emitter junction connected between ground potential and the inverting input of the comparator 390. The collector or output terminal of transistor 394 is communicated to the negative input terminal of comparator 390 and to the positive terminal of the battery 32. As shown herein, the resistors and capacitors connected to the comparator 390 are utilized to establish a frequency of oscillation that under normal battery conditions will permit the capacitor 352 to obtain its full boost voltage charge even during the relatively short time that corresponds to high engine speed (RPMs). Under normal battery voltage and temperature level conditions the circuitry adjacent to the comparator 390 has been set such that the capacitor 352 may be charged in approximately 2.3 msec. The inclusion of the transistor 391 within the oscillator 360 enhances its excellent temperature stability. Reference is briefly made to FIG. 7 which illustrates that the boost voltage generator 70 utilizes for example four current pulses to excite the inductor 350 to charge the boost capacitor 352 to the desired level of boost voltage which is nominally 80 volts above the battery voltage. The precise number of current pulses used to excite the inductor 350 is a design parameter. The free-running oscillator 360 includes means for adapting its frequency in proportion to incremental changes in the voltage potential of the battery 32. This is accomplished by feeding back the battery potential through transistor 394 to the negative input terminal of the comparator 390. The output of the free-running oscillator 360 is a series of pulses at a predetermined frequency. This output is communicated to the two-transistor buffer 362. The two transistors 396 and 398 which comprise the buffer 362 are connected in parallel such that they can accommodate substantial levels of current. The output of the buffer 362 as previously noted is connected to the power driver 364 comprising transistors 400, 402, diodes 404a, b, and c. In response to the pulses generated by the free running oscillator 360 the output transistor 402 of the power drive 364 is made conductive therein providing a charging path from the battery 32 through the inductor 350 to ground. Upon the termination of each pulse the transistor 402 is turned off and the current flowing through the inductor 350 is diverted to the boost capacitor 352. As further illustrated in FIG. 7 the voltage stored on the capacitor 352 increases in a stepwise manner in response to the inductor discharge. The boost voltage is monitored by and communicated to the voltage level shifting circuit 386 comprising the comparator 410. In cooperation with the action of the voltage dividing resistors 412 and 414 the monitored value of boost voltage communicated to the positive terminal of comparator 410 is significantly reduced. When this monitored value of boost voltage exceeds the reference level which may be as an example, 2.5 volts, an output signal from comparator 410 is generated indicating that the stored voltage on capacitor 352 has reached its desired level. The signal generated by comparator 410 is communicated to transistor 420 of the inhibit circuit 366. This signal turns on the transistor 420 thus shorting the output of the comparator 390 of the free-running oscillator 360 to ground and thereby temporarily turning it off and inhibiting its operation which in turn prohibits further increases in the level of stored voltage on capacitor 352.

The output of the level shifting circuit 368 is also communicated to the no-boost circuit 370. The no-boost circuit 370 comprises an input transistor 430 having its collector-emitter junction paralleled by a storage capacitor 432. The positive terminal of the capacitor 432 is connected to reference voltage through appropriate resistors. The output of the no-boost circuit comprises the voltage on the capacitor 332. This signal, designated as NB, is communicated to pin P13 as shown in FIGS. 2 and 4. AS previously indicated even under low battery conditions, the boost voltage generator 70 is designed to charge the boost capacitor 352 relatively rapidly. Consequently, under the normal operation of the boost voltage generator 70 the output of comparator 410 will generate a logical high signal indicative of the fact that the boost capacitor 352 has been fully charged. During the interval when the boost capacitor 352 is being charged the storage capacitor 432 is connected to the regulated 5-volt supply. The voltage thereacross will exponentially approach the reference supply level. If the voltage across the storage capacitor 432 is not modified it will, after a predetermined interval, exceed a predetermined trigger level indicative of the fact that the boost capacitor 352 has not yet achieved its required level of boost voltage. However, as previously mentioned under normal operating conditions the boost capacitor 352 will indeed, rather quickly, achieve the required level of boost voltage. This information is communicated through comparator 410 to the base of the transistor 430. This signal then renders the transistor 430 conductive and hence discharges the capacitor 432 before it reaches the predetermined trigger level which would activate comparator 442 to trigger the transistor 420 of the inhibit circuit 366. Reference is again briefly made to the inhibit circuitry 366. As noted above it is desirable to also inhibit the operation of the free running oscillator 360 during the interval of time when any pull-in signal is present. The reason for this is that during the presence of the pull-in signal the hybrid power circuit 80 will be discharging the voltage on the boost capacitor 352 through to a particular injector coil 52. To accomplish this the inhibit circuit 366 ORs the individual pull-in signals generated by each of the switching control networks 60 via the diode OR gate 436. The output of the OR gate 436 is communicated to another switching transistor 438 the output of which is communicated to the comparator 390. Upon receipt of any pull-in signal the transistor 438 is switched to its conductive state therein grounding the output of comparator 390 which inhibits the operation of the oscillator 360.

The final major circuit function illustrated on FIG. 8 is the diagnostic circuit 90. The diagnostic circuit 90 is responsive to the no-boost signal generated by the no-boost circuit 370 and to the short detect signals generated by any of the switching control networks 60. The short detect signals and the no-boost signal are communicated to an OR-gate 440 the output of which is communicated to a comparator 442. Upon receipt of a short detect signal or upon receipt of the no-boost signal the output of comparator 442 will go high and remain high because of the latching effect provided by the positive feedback through resistor 444. The high logic output of comparator 442 is inverted by the inverter 382 which in turn reduces the normally high output level of the output stage 384 thus indicating that a fault has occurred. The startup circuitry 386 comprising the comparator 452, charging capacitor 454, switching transistor 456 and output transistor 458 insures that during the period of time that the reference voltage is stabilizing (which occurs during startup) a false detect signal will not be generated.

Figure 9:
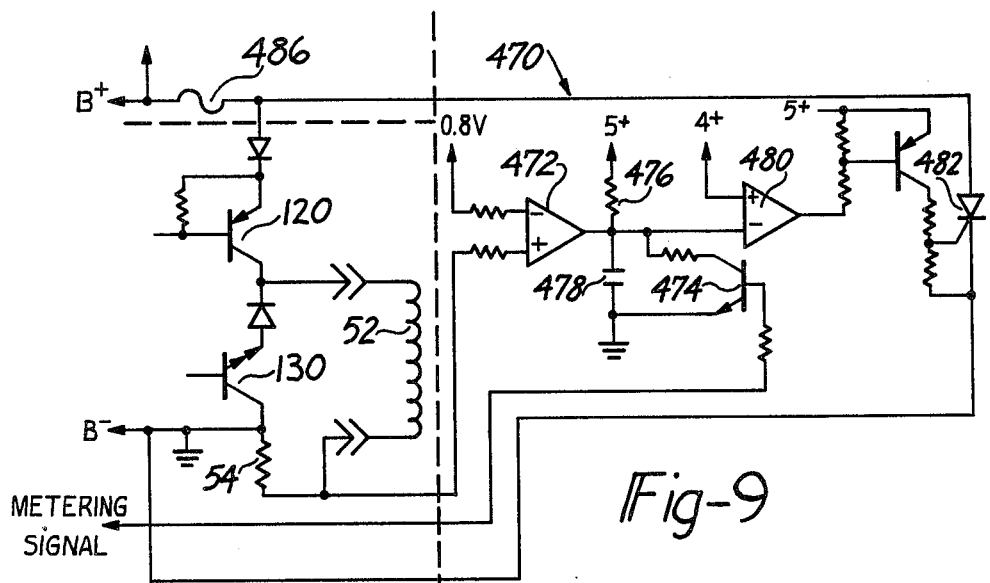
FIG. 9 illustrates a current level sensing network.

Reference is made to FIG. 9 which illustrates a fail-safe network that may be incorporated within the solenoid control unit 20. FIG. 9 illustrates one of the circuits that could be incorporated with each of the injectors 50. The fail-safe circuit or network 470 illustrated therein is positioned to the right of the phantom line. To the left of that line there is an exemplary injector coil 52. The injector coil 52 is communicated to the recirculating transistor 130 and the power source transistor 120 of the hybrid power unit in the same manner as illustrated in FIG. 3. The function of the fail-safe network 470 is to detect the condition of abnormal current flow within the injector coil 52. However, care must be taken not to falsely activate the circuit during situations when current is desired to flow through an injector 50 i.e., during injector activation. Consequently, the fail-safe circuit 470 tests the current flowing within the injector only during intervals not involving a metering pulse. The voltage across a particular sense resistor 54 is communicated to a comparator 472. The output of comparator 472 is held to ground during intervals involving receipt of a metering pulse by the switching transistor 474 which is maintained in a conductive state therein shorting the output of the comparator 472 to ground. During the absence of a metering pulse the voltage across the resistor-capacitor combination of resistor 476 and capacitor 478 is permitted to exponentially approach the reference voltage level. The exponential rise of the capacitor voltage induces a delay within the system. The capacitor 478 is communicated to a threshold detector network comprising another comparator 480, the output of which is communicated to an SCR crowbar network 482. The crowbar network 482 is connected between ground and battery. Upon the triggering of the threshold detect network 470 which is indicative of the situation of abnormal current flow SCR momentarily connects the battery 32 to a voltage substantially approaching ground voltage. This causes a surge of current to flow through the fuse 486 which is of the fast blowing variety which removes the malfunctioning injector 50 and its associated electronics from the system.

Many changes and modifications in the abovedescribed embodiment of the invention can of course be carried out without departing from the scope thereof. Accordingly, that scope is intended to be limited only by the scope of the appended claims.

Having thus described the invention what is claimed is:

1. A boost voltage generator (70) for an injector connected to a voltage potential including a battery (32) for periodically generating a voltage signal in excess of such voltage potential in response to pull-in signals input thereto, and for storing the voltage signal on a boost capacitor (352) interposing the voltage generator (70) and the voltage potential (32), comprising:
   free running oscillator means (360) for generating a first signal the frequency of which is dependent upon the level of such voltage potential;
   power driver means (364) for generating a series of pulses in response to the output of said free running oscillator means (360), the output of said power driver means (364) connected to the anode of a diode (103) and to ground potential for selectively creating a current charge path through a boost coil (350) connected between the battery (32), the diode (103) and the boost capacitor (352) and for thereafter terminating said current path to permit the electrical energy within the boost coil (350) to be transferred and stored on said boost capacitor (352);
   boost voltage indicating means including a level shifting means (412, 414) for generating an output signal indicative of the voltage stored on said boost capacitor (352);
   inhibit means responsive to the pull-in signals (60) and to the output of the level of shifting means for inhibiting the operation of said free running oscillator (360) during those intervals involving a pull-in signal and during those intervals when said boost capacitor (352) has been charged to a predetermined voltage level; and
   no-boost circuit means (370) for generating a signal indicative of the situation that said boost coil (352) has not attained its desired charge within a predetermined time interval.

2. The voltage generator (70) as defined in claim 1 wherein said free running oscillator means comprises:
   a comparator (390);
   a charging capacitor (C101) connected across ground potential and the non-inverting input to said comparator and reference voltage connected to the non-inverting input to said comparator, the comparator (390) provided with means for charging said charging capacitor (C101) at two different rates;
   a first transistor (392) having its base connected to the output of said comparator (390) and its collector connected to a reference potential; and
   a second transistor (394) having its base connected to the collector of said first transistor (392) and its collector communicated to the inverting input of said comparator (390) and to the battery.

3. The voltage generator (70) as defined in claim 2 wherein said charging means comprises a second resistor (R102) connected between said reference potential and the inverting input of said comparator; and
   a third transistor (391) having its base connected to the collector of said second transistor (394), its collector connected to the inverting input through a third resistor (R101) and its emitter connected to the grounded terminal of the charging capacitor (C101).

4. The voltage generator as defined in claims 2 or 3 wherein said inhibit means includes a second comparator (410) connected to the level shifting means for generating an output signal when the output voltage of said level shifting means is at a predetermined level; and
   a fourth transistor (420) having an input communicated to the output of said level shifting means, its emitter grounded and its collector connected to the output of said comparator (390) for grounding the output of said comparator (390) during intervals involving the output signal generated by said level shifting means.

5. The voltage generator (70) as defined in claim 1 wherein said no-boost means (370) includes:
   an input transistor (430) having its collector-emitter junction paralleled by a storage capacitor (432); the positive terminal of said capacitor (432) connected to reference voltage, the emitter terminal of said transistor (430) and the negative terminal of said capacitor (432) connected to ground potential, and the base terminal of said transistor (430) connected to the output of said level shifting means (333).

6. The voltage generator (70) as defined in claim 4 wherein said no-boost means (370) includes:
   an input transistor (430) having its collector-emitter junction paralleled by a storage capacitor (432); the positive terminal of said capacitor (432) connected to reference voltage, the emitter terminal of said transistor (430) and the negative terminal of said capacitor (432) connected to ground potential, and the base terminal of said transistor (430) connected to the output of said level shifting means (333).

7. A boost voltage generator (70) for an injector connected to a voltage potential including a battery (32) for periodically generating a voltage signal in excess of such voltage potential in response to pull-in signals input thereto, and for storing the voltage signal on a boost capacitor (352) interposing the voltage generator (70) and the voltage potential (32), comprising:
   free running oscillator means (360) for generating a first signal the frequency of which is dependent upon the level of such voltage potential;
   power driver means (364) for generating a series of pulses in response to the output of said free running oscillator means (360), the output of said power driver means (364) connected to the anode of a diode (103) and to ground potential for selectively creating a current charge path through a boost coil (350) connected between the battery (32), the diode (103) and the boost capacitor (352) and for thereafter terminating said current path to permit the electrical energy within the boost coil (350) to be transferred and stored on said boost capactior (352);
   boost voltage indicating means including a level shifting means (412, 414) for generating an output signal indicative of the voltage stored on said boost capacitor (352);

inhibit means responsive to the pull-in signals (60) and to the output of the level of shifting means for inhibiting the operation of said free running oscillator (360) during those intervals involving a pull-in signal and during those intervals when said boost capactior (352) has been charged to a predetermined voltage level; and wherein said free running oscillator means comprises:
 a comparator (390);
 a charging capacitor (C101) connected across ground potential and the non-inverting input to said comparator and reference voltage connected to the non-inverting input to said comparator, the comparator (390) provided with means for charging said charging capacitor (C101) at two different rates;
 a first transistor (392) having its base connected to the output of said comparator (390) and its collector connected to a reference potential; and
 a second transistor (394) having its base connected to the collector of said first transistor (392) and its collector communicated to the inverting input of said comparator (390) and to the battery.

8. The voltage generator (70) as defined in claim 7 wherein said charging means comprises a second resistor (R102) connected between said reference potential and the inverting input of said comparator; and
 a third transistor (391) having its base connected to the collector of said second transistor (394), its collector connected to the inverting input through a third resistor (R101) and its emitter connected to the grounded terminal of the charging capacitor (C101).

9. The voltage generator as defined in claim 8 wherein said inhibit means includes a second comparator (410) connected to the level shifting means for generating an output signal when the output voltage of said level shifting means is at a predetermined level; and
 a fourth transistor (420) having an input communicated to the output of said level shifting means, its emitter grounded and its collector connected to the output of said comparator (390) for grounding the output of said comparator (390) during intervals involving the output signal generated by said level shifting means.

10. The voltage generator (70) as defined in claim 9 wherein said no-boost means (370) includes:
 an input transistor (430) having its collector-emitter junction paralleled by a storage capacitor (432); the positive terminal of said capacitor (432) connected to reference voltage, the emitter terminal of said transistor (430) and the negative terminal of said capacitor (432) connected to ground potential, and the base terminal of said transistor (430) connected to the output of said level shifting means (333).

* * * * *